(12) United States Patent
Tohei et al.

(10) Patent No.: US 9,601,679 B2
(45) Date of Patent: Mar. 21, 2017

(54) THERMOELECTRIC MODULE AND METHOD OF MANUFACTURING THE SAME

(71) Applicant: Hitachi Chemical Co., Ltd., Chiyoda-ku, Tokyo (JP)

(72) Inventors: Tomotake Tohei, Tokyo (JP); Shinichi Fujiwara, Tokyo (JP); Zenzo Ishijima, Tokyo (JP); Takahiro Jinushi, Tokyo (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 14/248,831

(22) Filed: Apr. 9, 2014

(65) Prior Publication Data

US 2014/0305482 A1 Oct. 16, 2014

(30) Foreign Application Priority Data

Apr. 10, 2013 (JP) .................................. 2013-081732

(51) Int. Cl.
*H01L 35/30* (2006.01)
*H01L 35/32* (2006.01)
*H01L 35/08* (2006.01)

(52) U.S. Cl.
CPC .............. *H01L 35/32* (2013.01); *H01L 35/08* (2013.01)

(58) Field of Classification Search
None
See application file for complete search history.

(56) References Cited

U.S. PATENT DOCUMENTS

| 5,429,680 A | * | 7/1995 | Fuschetti | ................ H01L 35/32 136/203 |
| 5,552,211 A | * | 9/1996 | Ackermann | .............. B32B 5/22 174/125.1 |

(Continued)

FOREIGN PATENT DOCUMENTS

| JP | 9-293906 A | 11/1997 |
| JP | 11-68175 A | 3/1999 |

(Continued)

OTHER PUBLICATIONS

Japanese-language Office Action issued in counterpart Japanese Application No. 2013-081732 dated Apr. 26, 2016 (Three (3) pages).

*Primary Examiner* — Eli Mekhlin
(74) *Attorney, Agent, or Firm* — Crowell & Moring LLP (57) ABSTRACT

In a configuration to join thermoelectric elements with an electrode in a thermoelectric module, reduction in junction reliability between the thermoelectric elements and the electrode is suppressed in a high-temperature environment and in an environment in which vibration and shock are imposed as load, to efficiently transmit the outer-circumferential temperature to the thermoelectric elements. In a thermoelectric module in which a plurality of p-type thermoelectric elements and a plurality of n-type thermoelectric element are alternately arranged by aligning the surfaces thereof on the high-temperature side and the surfaces thereof on the low-temperature side, to electrically connect the thermoelectric elements in series to each other; the p-type thermoelectric elements and the n-type thermoelectric element are joined via an intermediate layer with a deformable stress relaxation electrode, to thereby absorb stress taking place during the module assembling process and the module operation by the electrode.

4 Claims, 5 Drawing Sheets (56) References Cited

U.S. PATENT DOCUMENTS

| | | | |
|---|---|---|---|
| 2005/0139249 A1* | 6/2005 | Ueki et al. | 136/211 |
| 2007/0044828 A1* | 3/2007 | Iwanade et al. | 136/230 |
| 2010/0095997 A1* | 4/2010 | Weiss | H01L 35/32 |
| | | | 136/238 |
| 2010/0170550 A1 | 7/2010 | Hiroyama | |
| 2011/0099991 A1* | 5/2011 | Stefan et al. | 60/320 |
| 2011/0139206 A1* | 6/2011 | Ukita et al. | 136/224 |
| 2012/0160293 A1 | 6/2012 | Jinushi et al. | |

FOREIGN PATENT DOCUMENTS

| | | |
|---|---|---|
| JP | 2000-91649 A | 3/2000 |
| JP | 2000-188429 A | 7/2000 |
| JP | 2001-189497 A | 7/2001 |
| JP | 2001-326391 A | 11/2001 |
| JP | 2003-197983 A | 7/2003 |
| JP | 2003-234516 A | 8/2003 |
| JP | 3469811 B2 | 11/2003 |
| JP | 2005-57124 A | 3/2005 |
| JP | 2005-302851 A | 10/2005 |
| JP | 2007-103580 A | 4/2007 |
| JP | 2007-109942 A | 4/2007 |
| JP | 2008-305987 A | 12/2008 |
| JP | 2012-134410 A | 7/2012 |

\* cited by examiner

THERMOELECTRIC MODULE AND METHOD OF MANUFACTURING THE SAME

BACKGROUND OF THE INVENTION

The present invention relates to a thermoelectric module in which junction reliability is enhanced between a thermoelectric element and an electrode and to a method of manufacturing the thermoelectric module.

Thermoelectric modules in which thermal energy is converted into electric energy by use of the Zeebeck effect have advantages, for example, they include no driving section, they are simple in structure, and they are maintenance-free devices. Heretofore, due to low energy conversion efficiency, these modules have been employed in particular apparatuses in limited fields, for example, in power sources for use in the space. However, for the realization of an eco-friendly society, the thermoelectric modules have attracted attention in association with a method to recover thermal energy from exhaust heat. Discussion is underway to apply the thermoelectric modules to incinerators, industrial furnaces, apparatuses associated with cars, and the like. In consideration of this background, it has been desired to enhance durability and conversion efficiency and to lower the cost of the thermoelectric modules.

However, the thermoelectric modules put to practices today mainly include bismuth-tellurium-based thermoelectric elements as described in JP-A-9-293906, and are to be employed at a low temperature of 300° C. or less. Hence, when applying the thermoelectric modules to the industrial furnaces and the cars as described above, it is required to employ thermoelectric elements operable at higher temperature than bismuth-tellurium-based thermoelectric elements, for example, silicon-germanium-based, magnesium-silicide-based, and manganese-silicide-based thermoelectric elements.

In operation of a thermoelectric element, it is possible, by producing a temperature difference in thermoelectric elements, to convert heat into electricity. Hence, in a junction between a thermoelectric element and an electrode, stress takes place due to the thermal expansion difference between the thermoelectric element and the electrode in the module operating environment, leading to a fear of breaking in the junction and the thermoelectric element. The stress increases as the temperature in the operation environment becomes higher; or, as the linear expansion coefficient difference between the thermoelectric element and the material of the junction and that between the thermoelectric element and the electrode become greater. Particularly, this is quite an important phenomenon for a thermoelectric module which may be used in an environment at temperature of 300° C. or more. Further, depending on the allocating location of the thermoelectric module, vibration and shock may take place on the module. When vibration and shock take place in addition to the thermal stress appearing in the module, it is feared that breaking easily occurs in the junction and the thermoelectric element.

JP-A-2000-188429 describes a line-type thermoelectric conversion module in which p-type and n-type thermoelectric elements are connected to an Mo electrode by use of carbon and Ni brazing, and the respective thermoelectric elements are joined via oxide glass with each other, to thereby moderate thermal stress occurring due to temperature difference.

JP-A-2001-189497 describes a thermoelectric conversion element in which a substantially L-shaped n-type semiconductor material and a substantially L-shaped p-type semiconductor material are combined with each other according to the required number thereof and then are hot or cool compression-molded or are subjected to hot or cold processing based on powder metallurgy by use of different metallic materials on the high-temperature and low-temperature sides, into one block by forming pn junctions, the thermoelectric conversion element including a plurality of pn junctions in the connecting direction.

JP-A-2007-109942 describes a thermoelectric module in which p-type and n-type thermoelectric elements or thermoelements having mutually different linear expansion coefficients are alternately arranged on an insulative ceramic substrate, and respective thermoelements and the electrode are joined with each other by stress relaxation layers having mutually different linear expansion coefficients.

SUMMARY OF THE INVENTION

When the linear expansion coefficient varies between the p-type and n-type thermoelectric elements in the thermoelectric module, stress concentrates on the junctions between the thermoelectric elements and the electrodes due to thermal load in the joining process and the temperature change during the operation. This leads to a problem in which cracks appear in some elements and junctions and the reliability of junction is lowered. In addition, depending on the allocation environment of the thermoelectric module, there arises a fear that due to vibration and shock in the environment, the junction reliability is further deteriorated.

To join a thermoelectric element with an electrode, hard brazing or soft brazing such as soldering is employed as a joining material in many cases. For the hard brazing, due to the high joining temperature ranging from 600° C. to 800° C., it is required to arrange structure to lower the stress appearing in the junction during the cooling step of the joining process. On the other hand, for the soft brazing, since the joining temperature is 300° C. or less, the stress during the joining process can be lowered; however, since the melting point is also 300° C. or less, the use of soft brazing is limited to the thermoelectric modules to be operated at a low temperature.

Further, in a configuration in which different stress relaxation layers are formed on electrode junction surfaces of the respective elements, to thereby join the elements with the electrodes, it is required to beforehand form the stress relaxation layers on the elements. Due to the process to form the stress relaxation layers, unevenness becomes greater between the elements, leading to a problem of reduction in the joining efficiency during the module assembling process.

It is therefore an object of the present invention to provide a thermoelectric module which enhances the joining efficiency during the module assembling process to fulfill performance of the thermoelectric elements to the maximum extent and which is capable of securing high reliability in an environment in which thermal stress takes place in the module and in an environment in which vibration and shock are imposed as load onto the module.

To achieve the object above, the present invention has an aspect of, for example, a configuration as follows. The thermoelectric module according to the present invention is a thermoelectric module comprising a plurality of p-type thermoelectric elements and a plurality of n-type thermoelectric elements, all of or a part of the p-type thermoelectric elements and all of or a part of the n-type thermoelectric elements being electrically connected in series to each other, comprising a stress relaxation electrode produced in the form of woven fabric or nonwoven fabric using metallic fiber of either one selected from a group consisting of copper, nickel, aluminum, titanium, molybdenum, tungsten or wolfram, and iron or metallic fiber of an alloy primarily including either one selected from the group of the metals, the p-type thermoelectric elements and the n-type thermoelectric elements being joined together via the stress relaxation electrode.

According to the present invention, it is possible to provide a thermoelectric module which enhances the joining efficiency during the module assembling process to fulfill performance of the thermoelectric elements to the maximum extent and which is capable of securing high reliability in an environment in which thermal stress takes place in the module and in an environment in which vibration and shock are imposed as load onto the module.

Other objects, features and advantageous of the invention will become apparent from the following description of the embodiments of the invention taken in conjunction with the accompanying drawings.

In the structure according to the present invention, the p-type and n-type thermoelectric elements are connected to deformable stress-relaxation electrodes by use of a joining material.

DESCRIPTION OF THE EMBODIMENTS

Next, description will be given of an embodiment of the present invention by referring to the drawings. In the drawings, the same constituent components are assigned with the same reference numerals.

First Embodiment

Figure 1A:
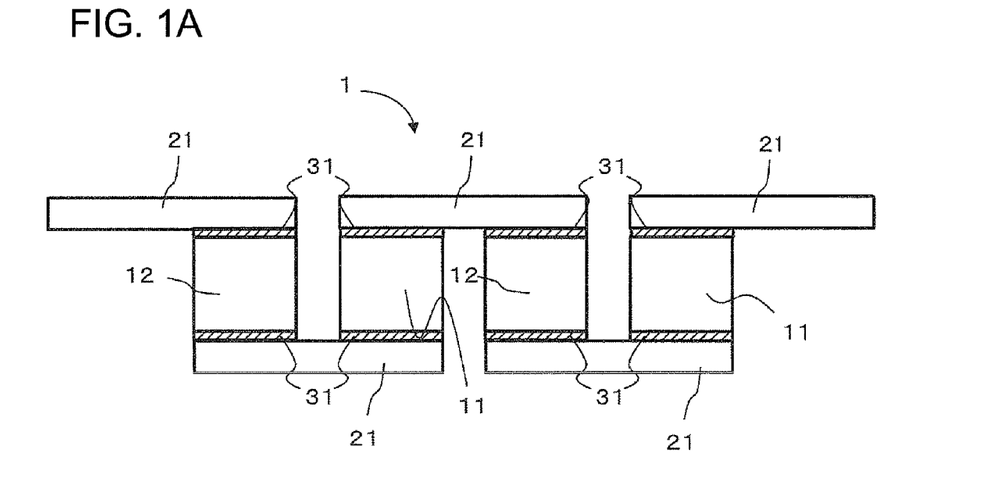
FIG. 1A is a side view showing the neighborhood of elements of a thermoelectric module of stress relaxation type in a first embodiment of the present invention.

FIG. 1A shows in a side view the neighborhood of elements of a thermoelectric module of stress relaxation type in a first embodiment of the present invention. This configuration includes a thermoelectric module element assembly 1, a p-type thermoelectric element 11, an n-type thermoelectric element 12, a stress relaxation electrode 21, and an intermediate layer 31 formed after the joining process. The p-type and n-type thermoelectric elements 11 and 12 are favorably thermoelectric elements including either one of the combinations of elements selected from a group consisting of silicon-germanium-based elements, iron-silicon-based elements, bismuth-tellurium-based elements, magnesium-silicon-based elements, manganese-silicon-based elements, lead-tellurium-based elements, cobalt-antimony-based elements, bismuth-antimony-based elements, Heusler-alloy-based elements, half-Heusler-alloy-based elements, and the like. On surfaces (junction surfaces) of the p-type and n-type thermoelectric elements 11 and 12, there may be formed a metallic film including nickel, aluminum, titanium, molybdenum, tungsten, palladium, chromium, gold, silver, and tin. The stress relaxation electrode 21 desirably includes woven fabric or nonwoven fabric produced using metallic fiber of either one selected from a group consisting of copper, nickel, aluminum, titanium, molybdenum, tungsten, and iron or metallic fiber of an alloy primarily including either one selected from the group described above. Further, on respective surfaces of the metallic fabric of the stress relaxation electrodes 21, there may be formed a metallic film formed by use of nickel, palladium, gold, silver, chromium, titanium, molybdenum, tungsten, or the like. The intermediate layer 31 favorably includes a metal selected from a group consisting of silicon, germanium, iron, bismuth, magnesium, manganese, lead, tellurium, cobalt, antimony, nickel, aluminum, titanium, molybdenum, tungsten, palladium, chromium, gold, silver, and tin or an alloy or an intermetallic compound primarily including one selected from the group of the metals.

In the description of the embodiment below, the p-type thermoelectric element 11 is a thermoelectric element produced by sintering, in the pulse discharge method, the hot press method, or the like, silicon-germanium powder containing impurities, for example, boron, aluminum, or gallium at 1% or less to impart the characteristic of the p-type semiconductor and silicon-magnesium powder containing impurities, for example, aluminum at 10% or less to impart the characteristic of the n-type semiconductor. That is, in the present embodiment, the p-type thermoelectric element 11 is a silicon-germanium element and the n-type thermoelectric element 12 is a magnesium-silicon element. Further, the stress relaxation electrode 21 includes metallic woven fabric produced by braiding fine wire of copper having a diameter of 70 μm (expansion coefficient of 16.5 ppm/° C.). However, the diameter of metallic wire is not particularly limited and ranges from 1 μm to 500 μm only if the wire can be braided. The braiding may be single, double, or triple braiding and is not particularly limited.

As FIG. 1A shows, the p-type and n-type thermoelectric elements 11 and 12 and the stress relaxation electrodes 21 are joined via the intermediate layer 31 at an upper end and a lower end thereof. The thermoelectric module is a module in which when a temperature difference takes place between both ends of the thermoelectric elements, electromotive force appears according to the temperature difference. Next, in conjunction with FIG. 1A, description will be given of a situation in which the upper surface is set to a high temperature and the lower surface is set to a low temperature.

Due to the temperature difference between the upper and lower surfaces, an electric current flows in the thermoelectric module element assembly 1. In the p-type thermoelectric elements, the current flows from the high-temperature side to the low-temperature side (upward in FIG. 1A). In the n-type thermoelectric elements, the current flows from the low-temperature side to the high-temperature side (downward in FIG. 1A). When these elements are connected in series to each other, an electric circuit is formed. The thermoelectric elements thus connected in series are joined together on a plane, in a line, or the like, to thereby configure the thermoelectric element assembly 1.

Figure 1B:
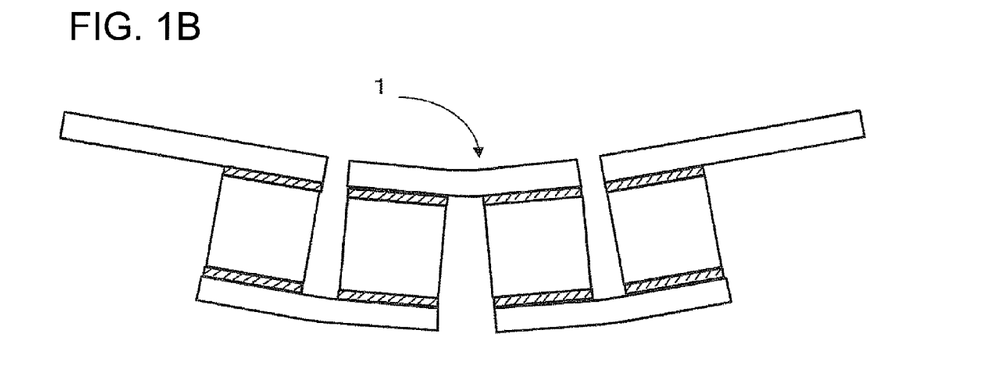
FIG. 1B is a side view showing a state in which the thermoelectric module of the first embodiment is deformed.

In this situation, the silicon-germanium element as the p-type thermoelectric element 11 has a linear expansion coefficient of 3.5 ppm/° C. and the silicon-magnesium element as the n-type thermoelectric element 12 has a linear expansion coefficient of 15.5 ppm/° C. Hence, it can be understood that when the p-type and n-type thermoelectric elements 11 and 12 are heated or cooled in the joining process and when the temperature of the actual operation environment thereof is changed, the expansion or contraction varies between the p-type and n-type thermoelectric elements 11 and 12. In the structure in which the respective thermoelectric elements are joined with the electrodes, stress and strain take place in the neighborhood of the junctions due to the mismatch of the Coefficient of Thermal Expansion (CTE) between the electrode material and the thermoelectric elements. It is hence feared that breaking and peeling take place in the junctions and cracks occur in the p-type and n-type thermoelectric elements 11 and 12. However, the structure of the present embodiment includes the deformable stress relaxation electrodes 21 formed by braiding fine copper wire. Hence, in the cooling process after the joining process and in a situation in which the temperature changes in the actual operation environment, the fine copper wire of the stress relaxation electrodes 21 freely deforms, and the stress and the strain caused by the CTE mismatch can be absorbed by the stress relaxation electrodes 21, to thereby obtain satisfactory junction reliability. Also, in an environment in which vibration and shock are imposed onto the thermoelectric module element assembly 1, since the stress relaxation electrodes 21 has a characteristic of cushions because a large number of pieces of fine copper wire are interwoven, the vibration and the shock loaded onto the thermoelectric module element assembly 1 can be absorbed. Further, when the stress relaxation electrode 21 is pressed from above or from below, the distance between the pieces of fine copper wire interwoven therein is reduced. Hence, the unevenness or dispersion in height of the elements, which is a problem in the assembling process of thermoelectric elements, can be adjusted by the stress relaxation electrodes 21. Also, as FIG. 1B shows, the stress relaxation electrode 21 is freely deformable. Hence, by deforming the thermoelectric element assembly 1, it is possible to follow any complex contours such as a cylindrical contour. This makes it possible to secure the temperature difference between the upper and lower surfaces of the thermoelectric module element assembly 1, to efficiently generate electric power.

Figure 2A:
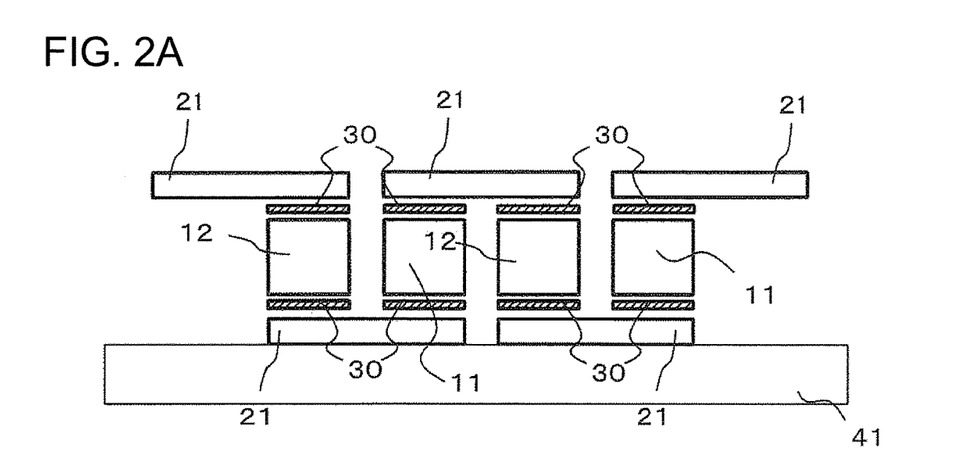
FIG. 2A is a side view to explain a method of manufacturing the stress-relaxation thermoelectric module of the first embodiment.
Figure 2B:
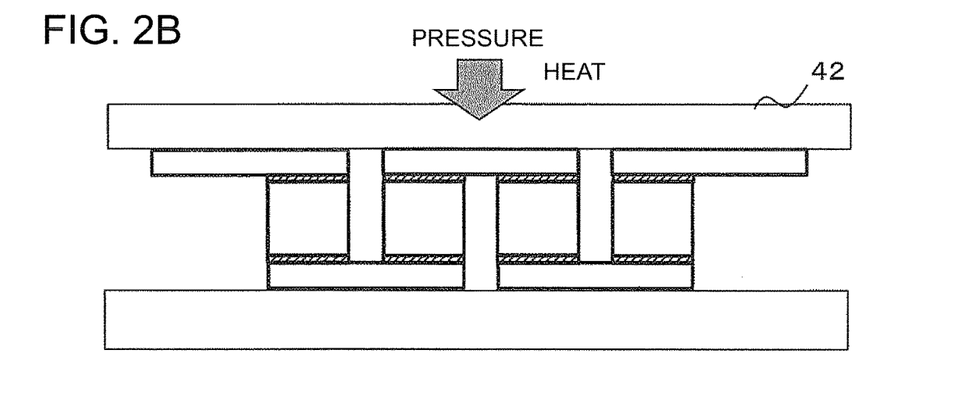
FIG. 2B is a side view showing a joining step of the manufacturing method after the step shown in FIG. 2A.
Figure 2C:
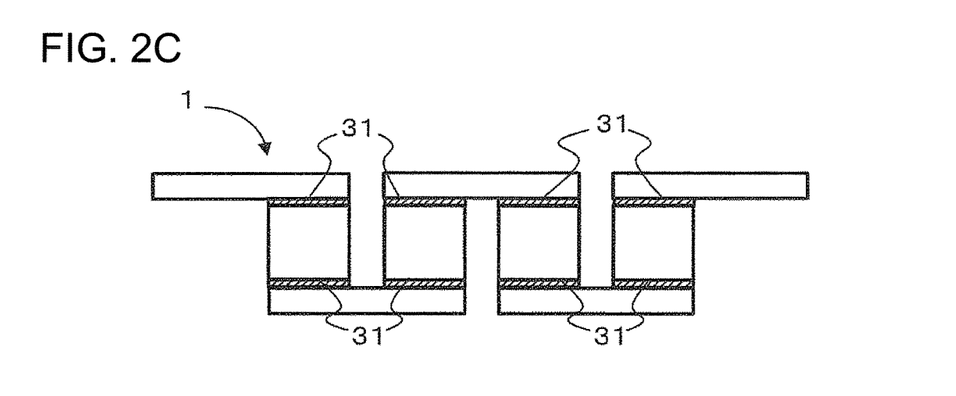
FIG. 2C is a side view showing a step to complete a thermoelectric element assembly.

FIGS. 2A to 2C are side views to explain a process flow in a method of manufacturing the stress-relaxation thermoelectric element assembly of the first embodiment. These side views include, in addition to the constituent components shown in FIG. 1, a joining material 30, a supporting jig 41, and a pressurizing jig 42. The p-type and n-type thermoelectric elements 11 and 12, the stress relaxation electrodes 21, and the intermediate layer 31 are the same in the configuration as for FIG. 1. The joining material 30 favorably includes a metal selected from a group consisting of silicon, germanium, iron, bismuth, magnesium, manganese, lead, tellurium, cobalt, antimony, nickel, aluminum, titanium, molybdenum, tungsten, palladium, chromium, gold, silver, and tin or an alloy primarily including one selected from the group of the metals. In the description of the assembly process, the joining material 30 is foil of aluminum or foil of aluminum alloy; or, foil including a clad material primarily including aluminum.

The supporting jig 41 and the pressurizing jig 42 include ceramics, carbon, metal or the like which is not melted in the joining process, that is, a material which does not react on the stress relaxation electrodes 21. Or, it is desirable to suppress the reaction by forming on the surfaces thereof, a layer which does not react on the stress relaxation electrodes 21. Description will be given of a flow of the assembly process of the thermoelectric element assembly 1 shown in FIG. 2 by referring to the assembly method of the thermoelectric module in conjunction with FIGS. 2A to 2C.

First, as FIG. 2A shows, the stress relaxation electrode 21 is arranged on the supporting jig 41. Thereafter, the joining material 30, the p-type thermoelectric element 11, and the n-type thermoelectric element 12 are sequentially positioned to be arranged on the stress relaxation electrode 21. The joining material 30 is again placed on the respective thermoelectric elements, and finally, the stress relaxation electrode 21 is disposed thereon. In this description, the joining material 30 is metallic foil and desirably has a thickness ranging from 1 μm to 500 μm. In the process, these constituent components may be arranged at a time by use of a jig, not shown; or, may be individually arranged. The method of arranging the components is not particularly restricted.

Next, as FIG. 2B shows, the assembly of the constituent components is pressurized by the pressurizing jig 42 from above and is heated at the same time, to join the stress relaxation electrode 21, the p-type thermoelectric element 11, and the n-type thermoelectric element 12 together via the joining material 30. In the joining process, it is desirable that the load imposed on the thermoelectric elements is 0.12 kPa or more. During the joining process, a diffusing reaction takes place between the joining material 30 and the stress relaxation electrode 21 or the respective thermoelectric elements, which turns the joining material 30 to the intermediate layer 31. Thereafter, as FIG. 2C shows, the supporting jig 41 and the pressurizing jig 42 are removed, to thereby obtain the thermoelectric element assembly 1.

Description has been given, by referring to FIGS. 2A to 2C, of a process to join the joining material 30 on the upper surface and the joining material 30 on the lower surface at a time. However, it is also possible that after either one joining material 30 is joined, the other one joining material 30 is joined. For example, it is possible that in the step shown in FIG. 2A, only the joining material 30 on the supporting jig 41 side and the thermoelectric element are arranged. Thereafter, the lower-side supporting jig 50 is heated to join, via the joining material 30, the thermoelectric element with the stress relaxation electrode 21 on the supporting jig 41 side. Thereafter, the upper surface of the thermoelectric element is joined with the stress relaxation electrode 21 via the joining material 30, to thereby form the thermoelectric module element assembly 1.

The pressure is set to 0.12 kPa or more to prevent an event in which the p-type and n-type thermoelectric elements 11 and 12 incline during the joining process and to absorb dispersion in height of the p-type and n-type thermoelectric elements 11 and 12 by deforming the stress relaxation electrode 21. The higher-most value of the pressure is not particularly limited. However, to prevent breakage of the elements, the higher-most value is less than the value corresponding to the strength of the elements against breakage by pressure. Specifically, the value may be about 1000 MPa or less. In the present embodiment, sufficient effect is obtainable when the value is set to about several MPa. It is only necessary that the joining atmosphere is a non-oxidizing atmosphere. Specifically, a vacuum atmosphere, a nitrogen atmosphere, an atmosphere of mixture of nitrogen and hydrogen, and the like may be employed.

Figure 3A:
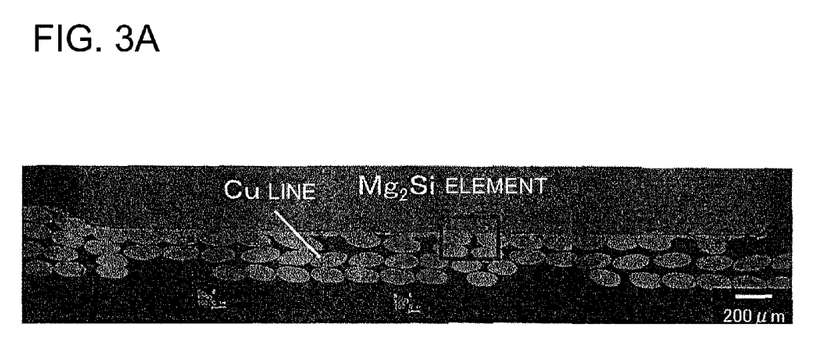
FIG. 3A is a diagram showing an example of a photographic image in cross section of junctions between elements and electrodes of the stress-relaxation thermoelectric module of the first embodiment.
Figure 3B:
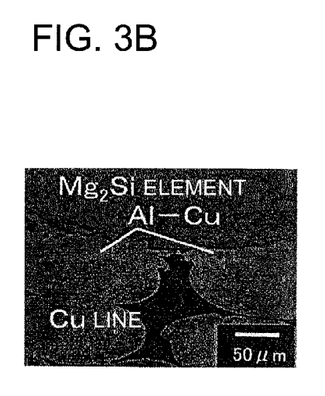
FIG. 3B is a diagram showing a magnified photographic image of the area enclosed by line segments in FIG. 3A.

FIGS. 3A to 3C show an example of photographic images in cross section of junctions between elements and electrodes of the stress-relaxation thermoelectric module of the first embodiment. These photographic images are obtained in a method shown in FIGS. 2A to 2C in which aluminum foil is interposed between a magnesium-silicon-based thermoelectric element and the stress relaxation electrode in which fine copper wire is braided. FIG. 3A shows an overall junction, and FIG. 3B shows a magnified image of the part enclosed with line segments in FIG. 3A. In the present embodiment, the intermediate layer 31 includes an alloy primarily including aluminum and copper. It can be confirmed that each fine copper wire configuring the stress relaxation electrode 21 and the magnesium-silicon-based thermoelectric element form an appropriate junction with the intermediate layer 3 interposed therebetween.

In another configuration, the stress relaxation electrode 21 is formed by braiding fine nickel wire or fine copper wire on which a metallic film of nickel is formed. When tin foil is employed as the joining material 30, the tin foil is melted when heated at a temperature exceeding its melting point, i.e., 232° C. After the tin foil is melted, a reaction takes place between the tin and nickel contained in the fine metallic wire or in the metallic film. As a result, a nickel-tin-based alloy or compound is obtained as the intermediate layer 31. Hence, each fine nickel wire or each fine copper wire on which a metallic film of nickel is formed configuring the stress relaxation electrode 21 and the thermoelectric element form an appropriate junction via the intermediate layer 3 interposed therebetween. Further, since $Ni_3Sn_4$ which is one of the nickel-tin-based compounds has a melting point of 794.5° C., it is possible, by turning the intermediate layer 31 to a compound, to enhance heat-resistant ability of the junction. When a metal such as tin or an alloy having a melting point of 300° C. or less is employed as the joining material 30, it is possible to join a low-temperature thermoelectric element including a bismuth-tellurium-based element and a Heusler-alloy-based element for use at 300° C. or less.

Further, in the configuration in which fine nickel wire or fine copper wire on which a metallic film of nickel is formed is braided in the stress relaxation electrode 21, when aluminum foil is employed as the joining material 30, an aluminum-nickel-based alloy or compound may be formed as the intermediate layer 31. Each fine nickel wire or each fine copper wire on which a metallic film of nickel is formed configuring the stress relaxation electrode 21 and the thermoelectric element form an appropriate junction with the intermediate layer 3 interposed therebetween. Since $Al_3Ni$ which is one of the aluminum-nickel-based compounds has a melting point of 854° C., it is possible by turning the intermediate layer 31 to a compound, to enhance heat-resistant ability of the junction.

As above, by appropriately selecting the fine metallic wire for the stress relaxation electrode 21 and the joining material 30 in association with the operation temperature and constituent components of the thermoelectric elements, it is possible to obtain an appropriate junction.

By beforehand forming a metallic film on the surfaces (junction surfaces) of the p-type and n-type thermoelectric elements 11 and 12, it is possible to simplify the production process and to form an appropriate junction.

Figure 4A:
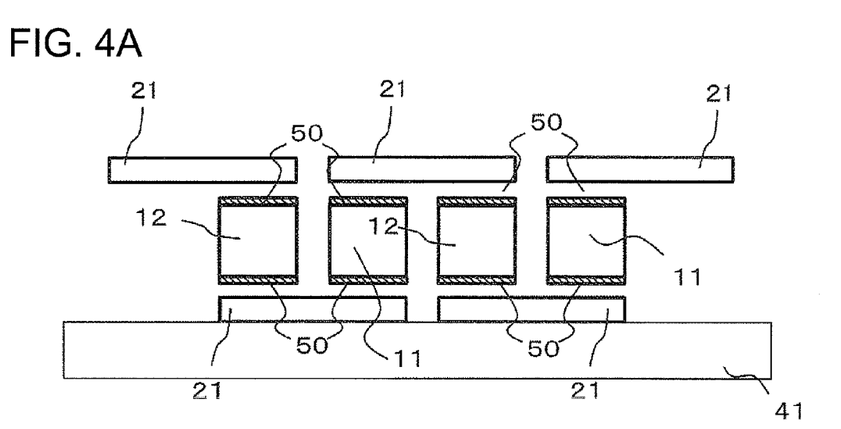
FIG. 4A is a perspective view showing an example of structure of the stress-relaxation thermoelectric module of the first embodiment.
Figure 4B:
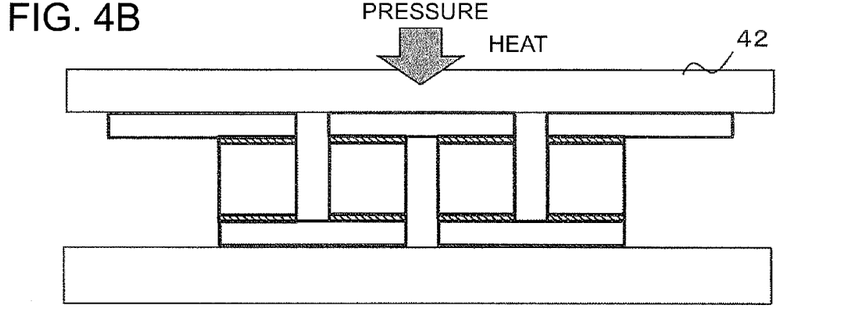
FIG. 4B a side view showing a joining step of the manufacturing method after the step shown in FIG. 4A.
Figure 4C:
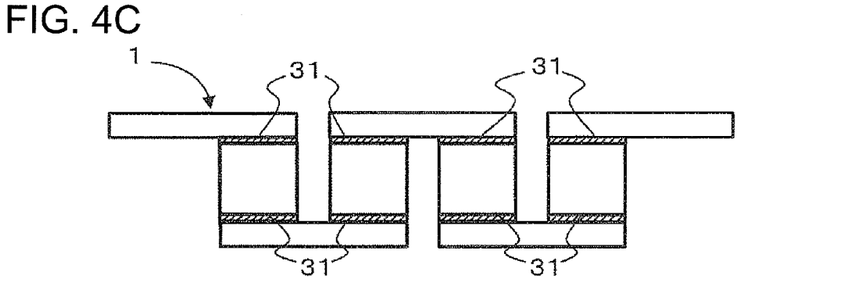
FIG. 4C is a side view showing a step to complete a thermoelectric element assembly.

FIGS. 4A to 4C are perspective views showing a flow of manufacturing the stress-relaxation thermoelectric element assembly when a metallic film is formed on the surfaces of thermoelectric elements of the first embodiment. The thermoelectric module element assembly 1, the p-type thermoelectric element 11, the n-type thermoelectric element 12, the stress relaxation electrode 21, the intermediate layer 31, the supporting jig 41, and the pressurizing jig 42 are substantially the same as for FIGS. 2A to 2C. The metallic film 50 favorably includes a metallic film including one selected from a group consisting of nickel, aluminum, titanium, molybdenum, tungsten, palladium, chromium, gold, silver, and tin.

Description will be given of the flow of a method of assembling the thermoelectric element assembly 1 shown in FIGS. 4A to 4C by referring to the method of assembling the thermoelectric module in conjunction with FIGS. 4A to 4C.

First, as FIG. 4A shows, the stress relaxation electrode 21 is arranged on the supporting jig 41. Thereafter, the p-type thermoelectric element 11 and the n-type thermoelectric element 12 are sequentially positioned to be arranged on the stress relaxation electrode 21. Then, the stress relaxation electrode 21 is again disposed on the respective thermoelectric elements. In this method, since the process shown in FIGS. 2A to 2C to arrange the joining material 30 is not required, the production process can be simplified. The metallic film 50 desirably has a thickness ranging from 100 nm to 500 μm. The method to form the metallic film 50 is not particularly limited. For example, the plating method, the aerosol deposition method, the thermal spraying method, the sputtering method, the vapor deposition method, the ion plating method, and the simultaneous sintering method may be employed. Next, as FIG. 4B shows, the assembly of the constituent components is pressurized by the pressurizing jig 42 from above and is heated at the same time, to join the stress relaxation electrode 21 with the p-type thermoelectric element 11 and the n-type thermoelectric element 12. In the joining process, it is desirable that the load imposed on the thermoelectric elements is 0.12 kPa or more. During the joining process, a diffusing reaction takes place between all or a part of the metallic film 50 and the stress relaxation electrode 21 or the respective thermoelectric elements, which turns the metallic film 50 to the intermediate layer 31. The pressurizing condition and the joining atmosphere are almost the same as for the process shown in FIGS. 2A to 2C.

For example, in a configuration in which an aluminum film is formed as the metallic film 50 on the surfaces of the thermoelectric elements and fine copper wire is braided in the stress relaxation electrode 21, it is possible, through pressurizing and heating, to form the intermediate layer 31 primarily including aluminum and copper which is almost the same as for FIGS. 3A and 3C. Further, for example, when a tin film is formed as the metallic film 50 on the surfaces of the thermoelectric elements and fine nickel wire or fine copper wire on which a metallic film of nickel is formed is braided in the stress relaxation electrode 21; as when the joining material is employed, each fine nickel wire or each fine copper wire on which a metallic film of nickel is formed configuring the stress relaxation electrode 21 and the thermoelectric elements form an appropriate junction via the intermediate layer 3 including a nickel-tin-based alloy or compound.

Further, for example, in a configuration in which a nickel film is formed as the metallic film 50 on the surfaces of the thermoelectric elements and fine nickel wire or fine copper wire on which a metallic film of nickel is formed is braided in the stress relaxation electrode 21, a solid-phase-solid-phase junction is formed through pressurizing and heating, to thereby form the intermediate layer 31 including almost the same components as for the metallic film 50. In this situation, after the joining process, the intermediate layer 31 has a melting point of nickel, i.e., 1455° C., and it is hence possible to enhance heat-resistant ability of the junction.

As above, even when the metallic film 50 is formed, it is possible to obtain an appropriate junction by appropriately selecting fine metallic wire for the stress relaxation electrode 21 in association with the operation temperature and constituent components of the thermoelectric elements.

Figure 5:
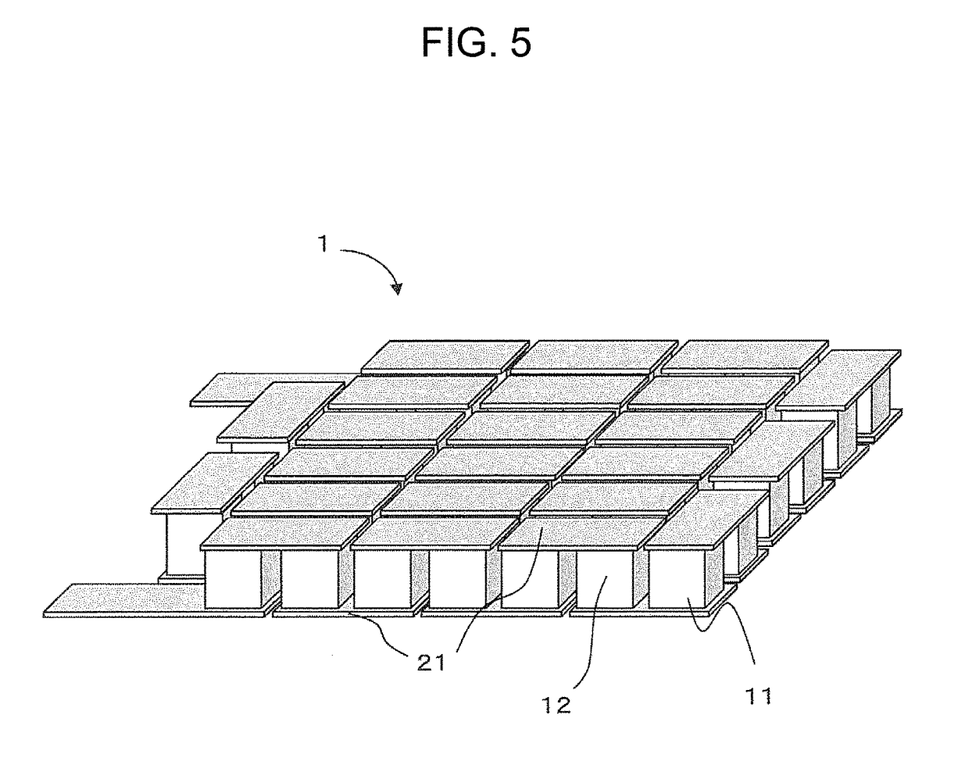
FIG. 5 is a perspective view to explain a manufacturing method of a stress-relaxation thermoelectric element assembly in a situation in which a metallic film is formed on a surface of the thermoelectric elements in the first embodiment.

FIG. 5 is a perspective view of an example of structure of the stress-relaxation thermoelectric module in the first embodiment in which 46 thermoelectric elements are arranged to be joined together in a matrix form. By using the process shown in FIGS. 2A to 2C or FIGS. 4A to 4C, the thermoelectric module assembly 1 shown in FIG. 5 is produced. This module may be sealed in a case for use or may be used without any case. In FIG. 5, the p-type and n-type thermoelectric elements 11 and 12 are in the form of a pole, for example, a quadrangular prism, a triangular prism, a polygonal prism, a circular cylinder, or an elliptic cylinder.

In the structure as shown in the first embodiment in which the p-type and n-type thermoelectric elements 11 and 12 are joined via the intermediate layer 31 with the deformable stress-relaxation electrodes 21, it is possible to provide thermoelectric module in which the joining performance is enhanced during the assembling process of the thermoelectric module and in which high reliability is secured even in an environment in which thermal stress takes place and even in an environment in which vibration and shock are imposed as load.

Second Embodiment

Referring now to FIGS. 1A and 1B again, description will be given of a second embodiment of the present invention. The configuration of the second embodiment is basically almost the same as for the first embodiment unless otherwise specified. The present embodiment differs from the first embodiment in that the stress-relaxation electrodes 21 includes porous metal of one selected from a group consisting of copper, nickel, aluminum, titanium, molybdenum, tungsten, and iron or an alloy primarily including either one selected from the group of the metals. On the porous-metallic item of the stress-relaxation electrode 21, there may be formed a metallic film including one selected from a group consisting of nickel, palladium, gold, silver, tin, chromium, titanium, molybdenum, and tungsten. Further, the stress-relaxation electrode 21 includes porous metal including continuous pores or independent pores formed at a porosity ranging from 10% to 99%. The porous metal may be produced in any method. For example, there may be employed the sintering method, and the pore forming method using the inert gas injection and foaming resin, and the spacer method. In the configuration of the present embodiment, a deformable porous metal item is employed as the stress-relaxation electrode 21. Hence, during the cooling process after the joining process and when the temperature changes in the actual operation environment, porous regions of the stress-relaxation electrode 21 freely deform. Hence, the stress-relaxation electrode 21 is capable of absorbing stress and strain caused by the CTE mismatch, leading to high junction reliability. Also, in an environment in which vibration and shock are imposed as load, metallic fiber is configured in the form of cells in the stress-relaxation electrode 21 and the porous region has a characteristic of cushions. Hence, the stress-relaxation electrode 21 can absorb the vibration and the shock loaded onto the thermoelectric module element assembly 1. Further, when the stress relaxation electrode 21 is pressed from above or from below, the porous regions are crashed and the associated distance is reduced. Hence, the dispersion in height of the elements, which is a problem in the assembling process of thermoelectric elements, can be adjusted by the stress relaxation electrodes 21. The method to produce the stress relaxation thermoelectric element assembly of the present invention is basically almost same as for the first embodiment described by referring to FIGS. 2A to 2C and FIGS. 4A to 4C.

As above, even when the stress relaxation electrodes 21 including a porous metal is employed, it is possible, as in the first embodiment, to form an appropriate junction by appropriately selecting the metal for the stress relaxation electrode 21 and the joining material 30 in association with the operation temperature and constituent components of the thermoelectric elements.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A thermoelectric module comprising:
   a plurality of p-type thermoelectric elements and a plurality of n-type thermoelectric elements, all of or a part of the p-type thermoelectric elements and all of or a part of the n-type thermoelectric elements being electrically connected in series to each other, and
   a stress relaxation electrode produced in the form of woven fabric or nonwoven fabric made of a braided fine nickel wire or a braided fine copper wire on which a metallic film of nickel is formed,
   the p-type thermoelectric elements and the n-type thermoelectric elements being joined together via the stress relaxation electrode, wherein a density of the woven or nonwoven fabric using the metallic fiber at a part of the stress relaxation electrode with the thermoelectric elements is greater than a density of the woven or nonwoven fabric at another part of the stress relaxation electrode without the thermoelectric elements, and wherein
   an intermediate layer is disposed only on upper and lower surfaces of the thermoelectric elements to which the stress relaxation electrode is joined, the intermediate layer being a nickel-tin-based alloy or compound, or an aluminum-nickel-based alloy or compound, and portions of the metallic fiber connected to the intermediate layer are closer to each other than portions of the metallic fiber not connected to the intermediate layer, the intermediate layer including a single metallic film and being bonded directly on the stress relaxation electrode.

2. The thermoelectric module according to claim 1, wherein
   the p-type thermoelectric elements and the n-type thermoelectric elements are thermoelectric elements comprising either one of the combinations of elements selected from a group consisting of silicon-germanium-based elements, iron-silicon-based elements, bismuth-tellurium-based elements, magnesium-silicon-based elements, manganese-silicon-based elements, lead-tellurium-based elements, cobalt-antimony-based elements, bismuth-antimony-based elements, Heusler-alloy-based elements, and half-Heusler-alloy-based elements.

3. The thermoelectric module according to claim 1, wherein
the stress relaxation electrode has porous metal with continuous pores or independent pores formed at a porosity ranging from 10% to 99%.

4. The thermoelectric module according to claim 1, wherein
the stress relaxation electrode has porous metal with continuous pores or independent pores formed at a porosity ranging from 10% to 99%.

* * * * *